United States Patent [19]
Ito et al.

[11] Patent Number: 5,289,424
[45] Date of Patent: Feb. 22, 1994

[54] PSEUDO-STATIC RANDOM ACCESS MEMORY

[75] Inventors: Nobuhiko Ito, Tenri; Makoto Ihara, Sakurai, both of Japan

[73] Assignee: Sharp Kabushiki Kaisha, Osaka, Japan

[21] Appl. No.: 934,919

[22] Filed: Aug. 25, 1992

[30] Foreign Application Priority Data

Dec. 18, 1991 [JP] Japan ................................. 3-335268

[51] Int. Cl.$^5$ ............................................. G11C 13/00
[52] U.S. Cl. .................................. 365/222; 365/203; 365/182; 365/189.11
[58] Field of Search ................... 365/222, 203, 189.01, 365/182, 189.11

[56] References Cited

U.S. PATENT DOCUMENTS 5,047,985  9/1991  Miyaja ................................. 365/203
5,083,047  1/1992  Horie et al. ......................... 365/203

Primary Examiner—Terrell W. Fears
Attorney, Agent, or Firm—Morrison & Foerster

[57] ABSTRACT

In a pseudo-static random access memory of the invention, refresh operations are conducted in a normal mode and a self-refresh mode. The memory includes a plurality of bit-line pairs each having two bit lines, a precharge voltage generating circuit for precharging the plurality of bit-line pairs to a first potential level during a precharge period in the normal mode, the circuit being electrically connected to the plurality of bit-line pairs during the precharge period in the normal mode; and bit line discharge circuit for discharging the bit-line pairs during a precharge period in the self-refresh mode, thereby decreasing the potential level of the bit-line pairs to a second potential level which is below the first potential level.

6 Claims, 2 Drawing Sheets

PSEUDO-STATIC RANDOM ACCESS MEMORY

BACKGROUND OF THE INVENTION

1. Field of the Invention

The present invention relates to a pseudostatic random access memory (pseudo-SRAM) in which refresh is performed in a self-refresh mode of a waiting state.

2. Description of the Prior Art

Since a memory cell structure of a dynamic random access memory (DRAM) is simple, a DRAM having a large memory capacity can be inexpensively produced. However, such a DRAM has a disadvantage in that the refresh operations are complicated. In order to cope with the disadvantage, a pseudo-SRAM has been developed. The pseudo-SRAM has a memory cell structure as simple as a DRAM, and the refresh operations can easily be conducted. Therefore, the pseudo-SRAM can be used as if it were a static random access memory (SRAM). In such a pseudo-SRAM, as in the general DRAM, two bit lines of a bit-line pair are first precharged to a potential level of $HV_{CC}$ which is half of a supply voltage of $V_{CC}$ by a precharge circuit. Then, data is read from a memory cell or refresh is performed.

FIG. 3 shows a precharge circuit used in such a prior art pseudo-SRAM. In the precharge circuit, two bit lines $11a$ and $11b$ of each bit-line pair 11 are shorted by setting a control signal A active during the precharge period. At the same time, a control signal B is made active, so that the respective bit lines $11a$ and $11b$ are connected to an $HV_{CC}$ generating circuit 13 via a common line 12. The $HV_{CC}$ generating circuit 13 generates a potential level of $HV_{CC}$ which is half of a supply voltage of $V_{CC}$ by potential dividing resistors $R_{11}$ and $R_{12}$ which have the same resistance values. The generated potential level of $HV_{CC}$ is output to the common line 12 via a current mirror circuit. Therefore, the potential levels of the bit lines $11a$ and $11b$ are fixed at the potential level of $HV_{CC}$ by the precharge circuit as a result of precharge.

In such a prior art pseudo-SRAM, it is necessary to perform the refresh operation in an adjusted manner with respect to the reading and writing operation in a normal mode. In the self-refresh mode, the refresh operation can be performed in an asynchronous manner with the external. In the self-refresh mode, each interval between refresh actions corresponds to a precharge period.

If the time period of the refresh cycle can be made longer in the self-refresh mode, the power consumption of the pseudo-SRAM can be reduced, so that the data can be retained for a long time even when a battery is used as the power supply.

However, in a case where the time period of the refresh cycle is merely made longer, a High level potential stored in a memory cell is dropped down to the vicinity of the potential level of $HV_{CC}$ due to a leak current, so that it becomes impossible to obtain a sufficient margin between the lowered potential level stored in the memory cell and the potential level of $HV_{CC}$. This results in an error operation of the refresh. If the potential level of the bit lines $11a$ and $11b$ is forcedly dropped below the potential level of $HV_{CC}$ in order to obtain a sufficient margin, a large current is required to drop the potential level of the bit lines $11a$ and $11b$. This causes an increase in power consumption.

As apparent from the above, the prior art pseudo-SRAM has a problem that, even if the time period of the refresh cycle in the waiting state is made longer, the power consumption cannot be reduced.

SUMMARY OF THE INVENTION

The pseudo-static random access memory of this invention in which refresh operations are conducted in a normal mode and a self-refresh mode, comprises: a plurality of bit-line pairs each having two bit lines; a precharge voltage generating circuit for precharging the plurality of bit-line pairs to a first potential level during a precharge period in the normal mode, the circuit being electrically connected to the plurality of bit line pairs during the precharge period in the normal mode; and bit line discharge means for discharging the bit-line pairs during a precharge period in the self-refresh mode, thereby decreasing the potential level of the bit-line pairs to a second potential level which is below the first potential level.

In the pseudo-SRAM according to the invention, during the precharge in the self-refresh mode, the bit line discharge means disconnects bit lines of bit-line pairs from the $HV_{CC}$ generating circuit, and shorts the two bit lines of each bit-line pair. This short causes the potential levels of the bit lines to be the vicinity of the potential level of $HV_{CC}$. The potential levels of the bit lines are further decreased by natural discharge during a sufficiently long precharge period in the self-refresh mode. As a result, the precharge potential of each bit line becomes lower than the potential level of $HV_{CC}$. Therefore, even when the High level potential of a memory cell is dropped to the vicinity of the potential level of $HV_{CC}$ due to the leak current, it is possible to leave a sufficient margin.

Consequently, since the refresh margin can be improved without an extra increase in power consumption, the time period of refresh cycle in the self-refresh mode is made longer and the power consumption in the self-refresh mode can be reduced.

In the above construction, however, the potential levels of the pair of bit lines which are shorted by the bit line discharge means are not always varied to the same potential level by natural discharge. Moreover, the time period of the precharge is not fixed, so that precharge potential levels may be different from each other. This results in that, when the precharge potential level of a certain bit-line pair is dropped to excess, it is difficult to leave a margin with respect to the Low level of the memory cell. Therefore, in the configuration in which the potential levels of the pairs of bit lines are held by the potential level holding means, the potential levels of the pairs of bit lines can be dropped by natural discharge down to an appropriate and predetermined which is lower than the potential level of $HV_{CC}$, and the potential levels of the pairs of bit lines are prevented from being further dropped. Moreover, the potential level holding means only holds the potential levels of the pairs of bit lines against natural discharge, so that the power is only slightly consumed.

For the same reasons, there may occur another phenomena where the potential levels of a pair of bit lines which are shorted by the bit line discharge means do not drop from the potential level of $HV_{CC}$ by natural discharge, so that a sufficient margin cannot be left with respect to the High level of the memory cell. In the configuration in which the potential levels of the pair of bit lines are forcedly fixed by the potential level fixing means in a last and short period of the precharge period, the potential level of each pair of bit lines can be dropped down to the appropriate and predetermined value which is lower than the potential level of $HV_{CC}$ during the self-refresh. Even in this case, since the potential levels have been already dropped to some degree by natural discharge, the power consumption is smaller as compared with the case where the potential levels are forcedly fixed from the first.

Thus, the invention described herein makes possible the advantage of providing a pseudo-SRAM in which the potential levels of bit lines are naturally discharged during a precharge period in a self-refresh mode. Accordingly, in the pseudo-SRAM, the precharge potential level of bit lines can be lowered below a potential level of $HV_{CC}$ without increasing the power consumption, so that a sufficient refresh margin can be ensured even when the time period of a refresh cycle is set longer.

This and other advantages of the present invention will become apparent to those skilled in the art upon reading and understanding the following detailed description with reference to the accompanying figures.

DESCRIPTION OF THE PREFERRED EMBODIMENTS

Figure 1:
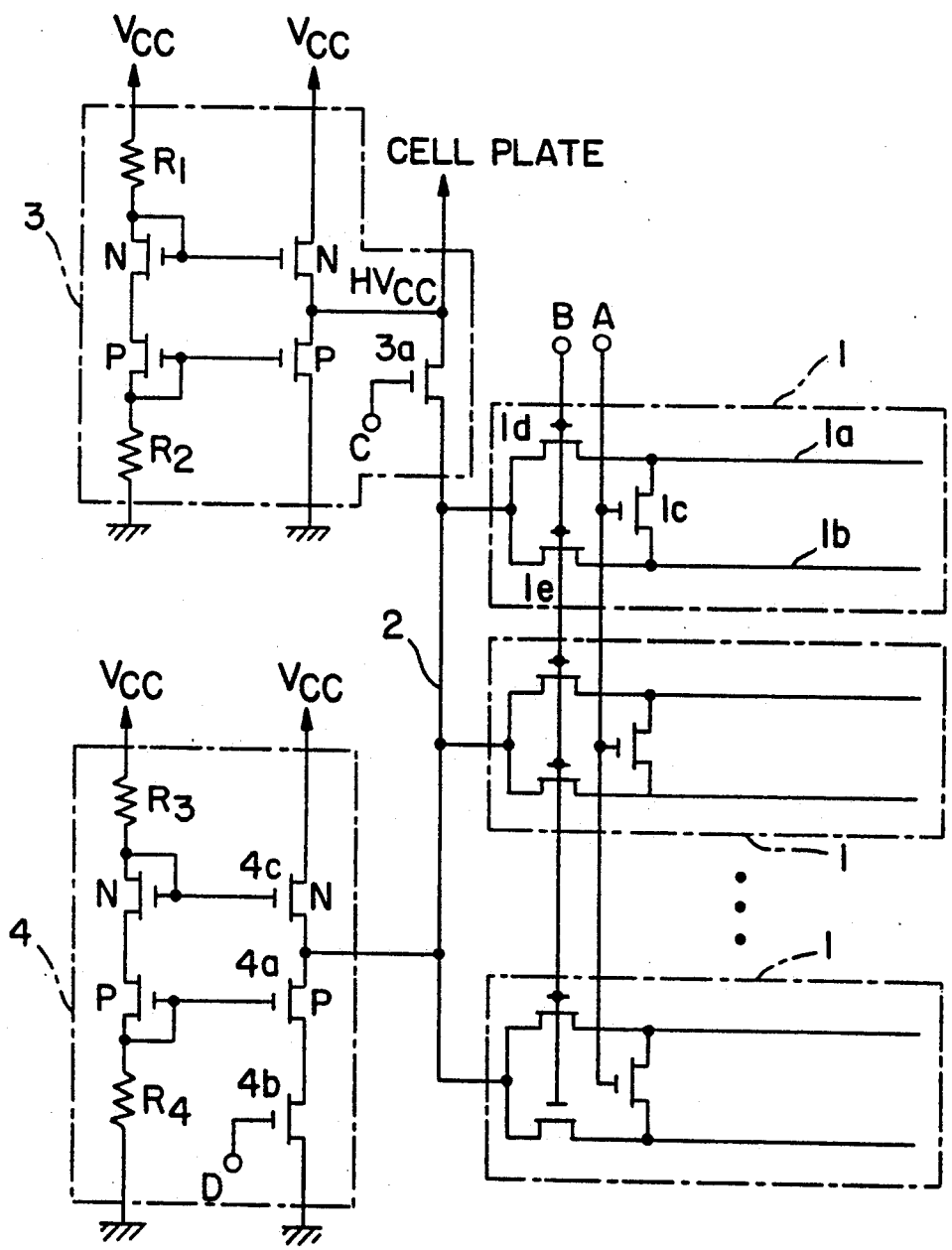
FIG. 1 is a circuit diagram showing a precharge circuit for bit-line pairs in one embodiment of the invention.
Figure 2:
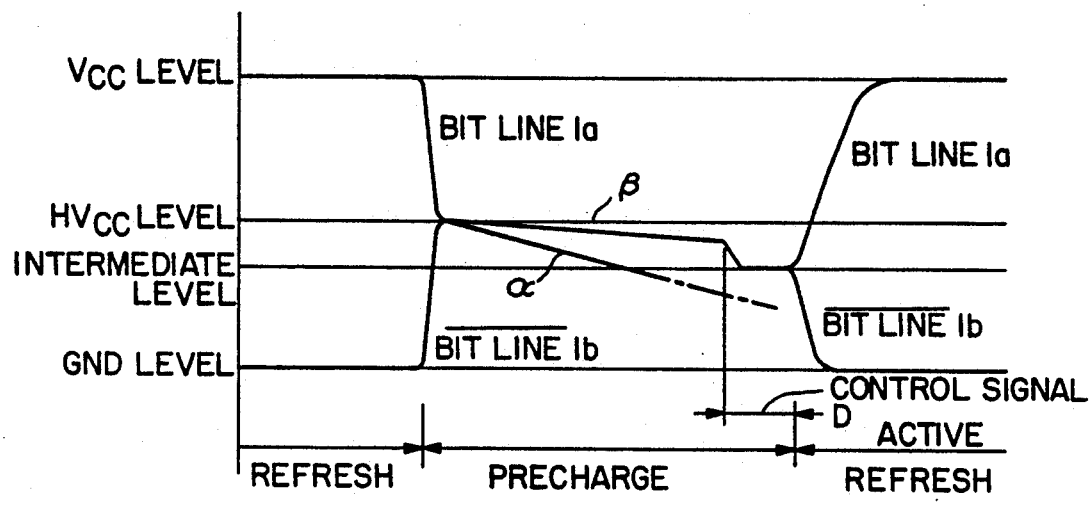
FIG. 2 is a time chart illustrating the precharge operation in the embodiment.
Figure 3:
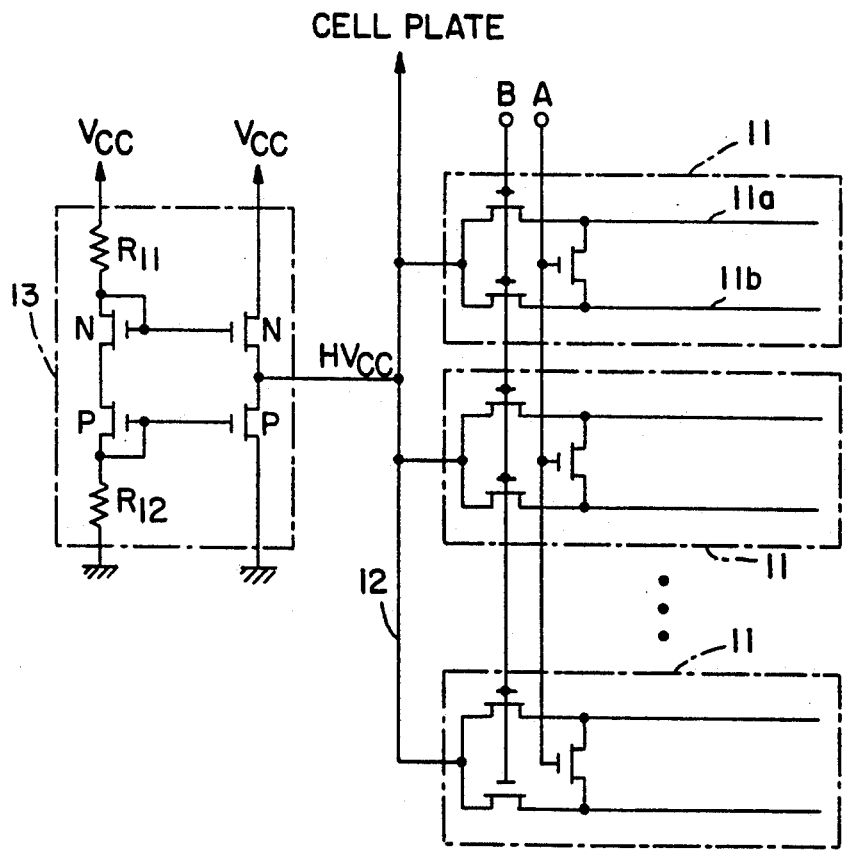
FIG. 3 is a circuit diagram showing a precharge circuit for bit-line pairs in a prior art pseudo-SRAM.

FIG. 1 shows a precharge circuit for pairs of bit lines of a pseudo-SRAM according to the invention. FIG. 2 is a time chart illustrating a precharge operation by the precharge circuit of FIG. 1.

The precharge circuit in this embodiment comprises a number of bit-lines pairs 1, an $HV_{CC}$ generating circuit 3 which is connected to the bit-line pairs 1 via a common line 2, and an intermediate level generating circuit 4, as shown in FIG. 1.

Each of the bit-line pairs 1 includes two bit lines 1a and 1b to which a number of memory cells (not shown) are connected. The potential of High level or Low level of a selected memory cell is read to the two bit lines 1a and 1b. The two bit lines 1a and 1b are connected to each other by a MOSFET 1c which is turned on by a control signal A. The two bit lines 1a and 1b are also connected to the common line 2 respectively via MOSFETs 1d and 1e which are turned on by a control signal B.

The $HV_{CC}$ generating circuit 3 generates a potential level of $HV_{CC}$ which is half of the supply voltage of $V_{CC}$ by potential dividing resistors $R_1$ and $R_2$ which have the same resistance values. The generated potential level of $HV_{CC}$ is output through a current mirror circuit. The $HV_{CC}$ generating circuit 3 is connected to the common line 2 via a MOSFET 3a which is turned on by a control signal C. The control signal C is set active in the normal mode, and inactive (or cut) in the self-refresh mode.

The intermediate level generating circuit 4 generates an intermediate potential level which is lower than the potential level of $HV_{CC}$ by potential dividing resistors $R_3$ and $R_4$. The resistance value of the resistor $R_3$ is higher than that of the resistor $R_4$. The generated potential of intermediate level is output through a current mirror circuit. A drain terminal of a MOSFET 4a on the output side of the current mirror circuit is grounded via a MOSFET 4b which is turned on by a control signal D. Therefore, during the off state of the MOSFET 4b, the MOSFET 4a on the output side of the current mirror circuit does not function, but only a MOSFET 4c functions. The control signal D is usually cut and is set active only in the last and short period of the precharge period in the self-refresh mode.

The operation of the precharge circuit used in the pseudo-SRAM having the above-mentioned configuration will now be described.

In the normal mode, the control signal C is set active and the control signal D is set inactive (or cut). As a result, the potential level of the common line 2 is fixed at the potential level of $HV_{CC}$. During the precharge period in the normal mode, the control signals A and B are set active so that the bit lines 1a and 1b of the bit-line pairs 1 are connected to the common line 2. Accordingly, the precharge potential level is fixed at the potential level of $HV_{CC}$ and the operation is performed as in the prior art.

When the pseudo-SRAM is in the self-refresh mode, the control signal C is inactive (or cut) and the $HV_{CC}$ generating circuit 3 is disconnected from the common line 2 by the MOSFET 3a which is turned off. The control signal D is usually inactive (or cut). When the refresh action is terminated and the next precharge period is started, the control signals A and B are set active. As a result, the bit lines 1a and 1b of each bit-line pair 1 are shorted and connected to the common line 2. As shown in FIG. 2, the potential levels of the bit lines 1a and 1b are first at a $V_{CC}$ level and a GND level, respectively. The potential levels are rapidly varied to the vicinity of the potential level of $HV_{CC}$ so as to be common. In accordance with the pseudo-SRAM of the invention, thereafter, the common potential level is gradually dropped by natural discharge since the $HV_{CC}$ generating circuit 3 is disconnected from the common line 2 by the MOSFET 3a during the precharge period in the self-refresh mode.

In a case where the common potential level of the bit lines 1a and 1b is rapidly dropped, for example as represented by a symbol α in FIG. 2, the common potential level reaches the intermediate level within the precharge period. In accordance with the pseudo-SRAM of the invention, the common potential level of the bit lines 1a and 1b is to be dropped below the intermediate level, the MOSFET 4c in the intermediate level generating circuit 4 is turned on. Accordingly, the intermediate level generating circuit 4 maintains the common potential level at the intermediate level or larger via the common line 2.

A symbol β in FIG. 2, for example, represents a potential profile in a case where the common potential level of the bit lines 1a and 1b is slowly dropped. If the common potential level is kept to be dropped as it is, the common potential level does not reach the intermediate level even at the end of the precharge period. When the control signal D is set active in the last and short period of the precharge period, the MOSFET 4b of the intermediate level generating circuit 4 is turned on. As a result, the MOSFET 4a of the current mirror circuit is turned on, and the intermediate level generating circuit 4 forcedly drops the common potential level of the bit lines 1a and 1b via the common line 2. As a result, the common potential level is fixed at the intermediate level by the intermediate level generating circuit 4.

In both the cases, the bit lines 1a and 1b are precharged to the intermediate potential level before the precharge period is terminated and the next refresh cycle is started. Generally, since the common potential level of the bit lines 1a and 1b is rapidly dropped by natural discharge during the precharge period as represented by the symbol α, the MOSFET 4c in the intermediate level generating circuit 4 consumes a little power to supply the potential level against the natural discharge. In the case where the common potential level of the bit lines 1a and 1b is slowly dropped, the common potential level is already dropped to some degree by natural discharge by the time when the control signal D is set active. Accordingly, the power consumption for forcedly dropping the common potential level down to the intermediate level is low.

As described above, according to the embodiment of the present invention, during the precharge period in the self-refresh mode, the bit lines 1a and 1b of each bit-line pair 1 are precharged to the intermediate potential level which is lower than the potential level of $HV_{CC}$. Therefore, a sufficient margin can be ensured even when the High level potential of the memory cell is dropped due to the leak current. Moreover, since, during the precharge period the self-refresh mode, the potential levels of the bit lines 1a and 1b are dropped by natural discharge, the power consumption is not increased. Accordingly, the time period of the refresh cycle of the pseudo-SRAM can be made longer and the data can be retained for a long time with low power consumption.

In the precharge circuit in the above embodiment, when the control is performed in such a manner that only the control signal A is set active and the control signal B is inactive (or cut) during the precharge period in the self-refresh mode, the bit lines 1a and 1b of each bit-line pair 1 are shorted and the potential levels of the bit lines 1a and 1b can be dropped below the potential level of $HV_{CC}$ by natural discharge. However, if the potential levels of the bit lines 1a and 1b are forcedly fixed at the intermediate level by the intermediate level generating circuit 4 as in the embodiment, it is possible to eliminate such possibilities that a margin with respect to the High level potential of a memory cell is insufficient due to the insufficient potential drop by natural discharge, or that a margin with respect to the Low level potential of a memory cell is insufficient due to an excessive potential drop.

As apparent from the above description, according to the pseudo-SRAM of the invention, the precharge potential level can be dropped to a level lower than the potential level of $HV_{CC}$ without extra power consumption. Therefore, it is possible to make the time period of the refresh cycle in the self-refresh mode longer, so as to reduce the power consumption in the waiting state of the pseudo-SRAM.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A pseudo-static random access memory in which refresh operations are conducted in a normal mode and a self-refresh mode, the memory comprising:
   a plurality of bit-line pairs each having two bit lines;
   a precharge voltage generating circuit for precharging the plurality of bit-line pairs to a first potential level during a precharge period in the normal mode, the circuit being electrically connected to the plurality of bit-line pairs during the precharge period in the normal mode; and
   bit line discharge means for discharging the bit-line pairs during a precharge period in the self-refresh mode, thereby decreasing the potential level of the bit-line pairs to a second potential level which is below the first potential level.

2. A pseudo-static random access memory according to claim 1, further comprising:
   first switch means for disconnecting the bit-line pairs from the discharge voltage generating circuit during the precharge period in the self-refresh mode.

3. A pseudo-static random access memory according to claim 2, further comprising:
   second switch means for electrically shorting the two bit lines of each of the plurality of bit-line pairs during the precharge period in the self-refresh mode.

4. A pseudo-static random access memory according to claim 2, further comprising:
   potential level holding means for holding the second potential level of the bit-line pairs at a predetermined or larger value which is lower than the first potential level during the precharge period in the self-refresh mode.

5. A pseudo-static random access memory according to claim 2, further comprising:
   potential level fixing means for fixing the second potential level of the bit-line pairs at a predetermined value which is lower than the first potential level at the last portion of the precharge period in the self-refresh mode.

6. A pseudo-static random access memory according to claim 2, wherein the first potential level is half of a supply voltage level.

* * * * *